United States Patent [19]
Rezeanu

[11] Patent Number: 5,889,728
[45] Date of Patent: Mar. 30, 1999

[54] WRITE CONTROL METHOD FOR MEMORY DEVICES

[75] Inventor: Stefan-Cristian Rezeanu, Colorado Springs, Colo.

[73] Assignee: Cypress Semiconductor Corporation, San Jose, Calif.

[21] Appl. No.: 21,681

[22] Filed: Feb. 10, 1998

[51] Int. Cl.[6] .................................................. G11C 8/00
[52] U.S. Cl. ...................... 365/233.5; 365/233; 365/194; 365/196; 365/230.08
[58] Field of Search ................................ 365/233, 233.5, 365/194, 196, 230.08

[56] References Cited

U.S. PATENT DOCUMENTS

| | | | |
|---|---|---|---|
| 4,272,832 | 6/1981 | Ito ...................................... | 365/230.08 |
| 4,286,174 | 8/1981 | Dingwall ............................. | 307/242 |
| 4,355,377 | 10/1982 | Sud et al. ............................ | 365/203 |
| 4,767,947 | 8/1988 | Shah ...................................... | 307/265 |
| 4,985,643 | 1/1991 | Proebsting ........................... | 307/443 |
| 5,003,513 | 3/1991 | Porter et al. ........................ | 365/230.08 |
| 5,039,875 | 8/1991 | Chang .................................. | 307/272.3 |
| 5,151,614 | 9/1992 | Yamazaki et al. ................... | 307/272.3 |
| 5,163,168 | 11/1992 | Hirano et al. ....................... | 307/265 |
| 5,172,012 | 12/1992 | Ueda .................................... | 307/272.3 |
| 5,177,375 | 1/1993 | Ogawa et al. ....................... | 307/272.3 |
| 5,187,686 | 2/1993 | Tran et al. ........................... | 365/189.11 |
| 5,218,237 | 6/1993 | Mao ...................................... | 307/265 |
| 5,278,788 | 1/1994 | Nomura ............................... | 365/189.01 |
| 5,285,414 | 2/1994 | Yamauchi et al. .................. | 365/189.01 |
| 5,306,958 | 4/1994 | Reddy et al. ........................ | 307/265 |
| 5,321,317 | 6/1994 | Pascucci et al. .................... | 307/296.4 |
| 5,337,276 | 8/1994 | Matsui ................................. | 365/189.11 |
| 5,343,082 | 8/1994 | Han et al. ............................ | 307/234 |
| 5,438,550 | 8/1995 | Kim ...................................... | 365/233.5 |
| 5,590,089 | 12/1996 | Roohparvar ......................... | 365/233.5 |
| 5,805,517 | 9/1998 | Pon ...................................... | 365/212 |

FOREIGN PATENT DOCUMENTS

| | | |
|---|---|---|
| 6085498 | 5/1985 | Japan . |
| 4129416 | 4/1992 | Japan . |

OTHER PUBLICATIONS

Wendell et al., "A 3.5ns, 2K×9 Self Timed SRAM", 1990 Symposium on VLSI Circuits, pp. 49–50.

Bonges, III et al., "A 576K 3.5–ns Access BiCMOS ECL Static RAM with Array Built–in Self–Test", Apr. 1992 IEEE Journal of Solid–State Circuits, pp. 649–656.

Chappell et al., "A 2–ns Cycle, 3.8–ns Access 512–kb CMOS ECL SRAM with a Fully Pipelined Architecture", Nov. 1991, IEEE Journal of Solid–State Circuits, vol. 26, No. 11, pp. 1577–1585.

(List continued on next page.)

Primary Examiner—David Nelms
Assistant Examiner—Andrew Q. Tran
Attorney, Agent, or Firm—Blakely Sokoloff Taylor & Zafman, LLP

[57] ABSTRACT

A three-step delay adjustment method for a "combine control signals" (CCS) block and related data delay blocks for a memory device (e.g., an asynchronous SRAM) is provided. The low complexity, easy delay tuning, balanced-delay CCS block is driven by slow slope control signals taken directly from the first stage (preferably not later than a weak inverter used in the hysteresis feedback portion) of stabilized trip point input buffers. The CCS block is able to generate global internal write pulses, appropriately timed with respect to circuits gating a data write to bitline access with an address transition detection (ATD) pulse, in order to provide stable, improved and balanced (between a plurality of control signals which can individually initiate and/or end a write in multiple distinct combinations) write parameter margins for the memory device. Additionally, intermediately generated signals in the CCS block are used for read-control, and a quarter-targeted data write bus enabling technique allows standby and transient current reduction in an improved trade-off with the chip enable access time for the memory device. Both the address set-up ($T_{sa}$) and the address hold ($T_{ha}$) margins are improved.

15 Claims, 8 Drawing Sheets

OTHER PUBLICATIONS

Childs et al., "An 18–ns 4K×4 CMOS SRAM", Oct. 1984, IEEE Journal of Solid–State Circuits, vol. SC–19, No. 5, pp. 545–551.

Flannagan et al., "Two 13–ns 64K CMOS SRAM's with Very Low Active Power and Improved Asynchronous Circuit Techniques", Oct. 1986, IEEE Journal of Solid–State Circuits, vol. SC–21, No. 5, pp. 692–703.

Kobayashi et al., "A 10–$\mu$W Standby Power 256K CMOS SRAM", Oct. 1985, IEEE Journal of Solid–State Circuits, vol. SC–20, No. 5, pp. 935–939.

Williams et al., "An Experimental 1–Mbit CMOS SRAM with Configurable Organization and Operation", Oct. 1988, IEEE Journal of Solid–State Circuits, vol. 23, No. 5, pp. 1085–1093.

WRITE CONTROL METHOD FOR MEMORY DEVICES

RELATED APPLICATION

This application is related to co-pending application Ser. No. 09/021,719, entitled "Write Control Apparatus for Memory Device", filed on Feb. 10, 1998, now pending, by Stefan-Cristian Rezeanu and assigned to the assignee of the present invention.

FIELD OF THE INVENTION

The present invention relates generally to memory devices and, more particularly, to the control of internal write operations for such devices.

BACKGROUND

Fast CMOS static random access memories (SRAMs) have become increasingly important in computer systems which require high speed and low standby current. A write architecture block diagram for a conventional SRAM 10 is illustrated in FIG. 1. One of multiple input data signals (Data_In_Pad) from an input/output (I/O) pad 12 are applied to the memory device and received at data buffer circuitry 14. Data buffer circuitry 14 is part of a data input path for the memory device and may receive a TTL-compatible signal Data_In_Pad from I/O pad 12. Within the data buffer circuitry 14, the Data_In_Pad signal may be presented to a voltage level converter which converts the TTL signals to CMOS-compatible signals for use in the memory device. The data buffer circuitry 14, which may also contain delay circuits to adjust the timing of the data signal with respect to an internal write control signal, generates a Data_In signal (generally, but not necessarily, a true and complement pair) which further propagates through an internal data input bus 16.

An Internal_Write signal may be generated from the write enable ($\overline{WE}$) and/or chip enable ($\overline{CE}$) signals presented to the memory device 10. For example, using write control logic 18, signal Internal_Write is developed from the $\overline{WE}$ and $\overline{CE}$ signals. Signal Internal_Write is subsequently applied to the input of data write driver 20. A faster and/or wider internal write signal (or simply components of it, e.g., even $\overline{WE}$ and/or $\overline{CE}$) may also gate the data input path at the data buffer 14 level (dashed line in FIG. 1).

At data write driver 20, signal Data_In is combined with (e.g., gated by) signal Internal_Write to produce internal write signals $\overline{datawrt0}$ and $\overline{datawrt1}$ which are logic complements during write operations. The internal write signals $\overline{datawrt0}$ and $\overline{datawrt1}$ are applied to the appropriate bitlines of memory device 10 through a data write bus 22 and a bitline interface to write data into selected individual memory cells.

For those memory devices which are organized into a number of groups of memory cells, each column (a–p) within a group of cells will have a corresponding bitline interface 24a–24p. The bitline interfaces 24a–24p are typically activated in response to group and column select signals Group/Column(O)-Group/Column(n), generated from address signals $A_o$–$A_m$ (e.g., from a system address bus) by a group and column select logic block 26. Thus, bitline interface 24a corresponds to group and column select signal Group/Column(O), etc., and in general, bitline interface 20p corresponds to group and column select signal Group/Column(n). The individual memory cells of a column are selected by wordlines 28a–28r in the conventional fashion.

Portions of the read path circuitry for memory device 10 are also illustrated in FIG. 1. Bitline signals from a pair of bitlines BL and $\overline{BL}$ are received by sense amplifiers 30a–30l. In response to corresponding Group-Enable signals, the sense amplifiers 30a–30l generate signals Data_Out which are provided to a global read data bus. In some cases, the global read data bus may be the same bus as the global write data bus 22. The Data_Out signals on the global read data bus may be provided to further circuitry to generate the output signals which are provided to the I/O pads (e.g., I/O pad 12).

In general, SRAMs such as memory device 10 illustrated in FIG. 1 have been required to provide faster and faster access times to accommodate ever increasing processor and bus speeds. This has led to decreased write cycle times for memory devices, which generally translate to a narrower internal write pulse ($\overline{datawrt0}$ or $\overline{datawrt1}$). However, in application Ser. No. 08/855,040, entitled "Method and Application for Preventing Write Operations in a Memory", filed May 13, 1997, now U.S. Pat. No. 5,825,715, by Stefan-Cristian Rezeanu, and assigned to the assignee of the present invention, the entire disclosure of which is hereby incorporated by reference, it was shown how the timing of the internal data write pulse impacts several write parameters. To overcome these problems, it was further shown how several write parameter (e.g., address set-up $T_{sa}$ and address hold $T_{ha}$) margins could be enhanced by the use of an apparatus which prevents memory writes to undesired locations by blocking the write using an address transition detection (ATD) signal. The apparatus is preferably implemented in a data write bus-to-bitline interface, for example, using passgates (gated by the ATD signal) to control access to a pair of biflines by a data write bus. In this way, improved write parameter margins are achieved without having to rely on narrowing the internal write pulse.

Another challenge facing the designers of modern SRAMs concerns the use of increased bit-size internal word-format designs. In the past, fast CMOS SRAMs were typically implemented as 8-bit word-format components (so-called ×8 parts). However, it is now becoming more common to implement large SRAMs as ×16 and larger word-format parts. With the use of such larger internal word-formats comes the use of increased numbers of signals to control write operations in such parts. For example, older ×8 parts often relied solely on one or two control signals (e.g., the write enable ($\overline{WE}$) and/or chip enable ($\overline{CE}$) signals shown in FIG. 1) to generate an internal write signal (e.g., signal Internal_Write in FIG. 1) which could then be used to gate an internal data signal. However, larger internal word-format parts often utilize additional signals (e.g., byte high enagble ($\overline{BHE}$) and byte low enable ($\overline{BLE}$) are a common choice for ×16 parts) to generate the internal write signal. The control of write operations in such a memory device while still preserving the write parameter margins for the device is addressed by the present invention.

SUMMARY OF THE INVENTION

The present invention provides, in one embodiment, a memory device (e.g., an asynchronous SRAM) having a low complexity, easy delay tuning, balanced-delay "combine control signals" (CCS) block, driven by slow slope control signals directly from the first stage (preferably not later than a weak inverter used in the hysteresis feedback portion) of a stabilized trip point input buffer, able to generate global internal write pulses appropriately timed with respect to the circuits gating the data write-to-bitlines access with an address transition detection (ATD) pulse, in order to provide stable, improved and balanced (between a plurality of control signals which can individually initiate and/or end a write in multiple distinct combinations) write parameter margins for the memory device. For an ATD-gated bitline access (preferable to improve the write parameter margins), an easy to implement three-step adjustment method is provided. This way, both the address set-up ($T_{sa}$) and the address hold ($T_{ha}$) margins are improved. Additionally, intermediately generated signals in the CCS block may be used for read-control, and a quarter-targeted data write bus enabling technique combined with a split path chip enable ($\overline{CE}$) control may allow standby and transient current reduction in an improved trade-off with the chip enable access time for the memory device.

BRIEF DESCRIPTION OF THE DRAWINGS

The present invention is illustrated by way of example, and not limitation, in the figures of the accompanying drawings in which.

DETAILED DESCRIPTION

Figure 1:
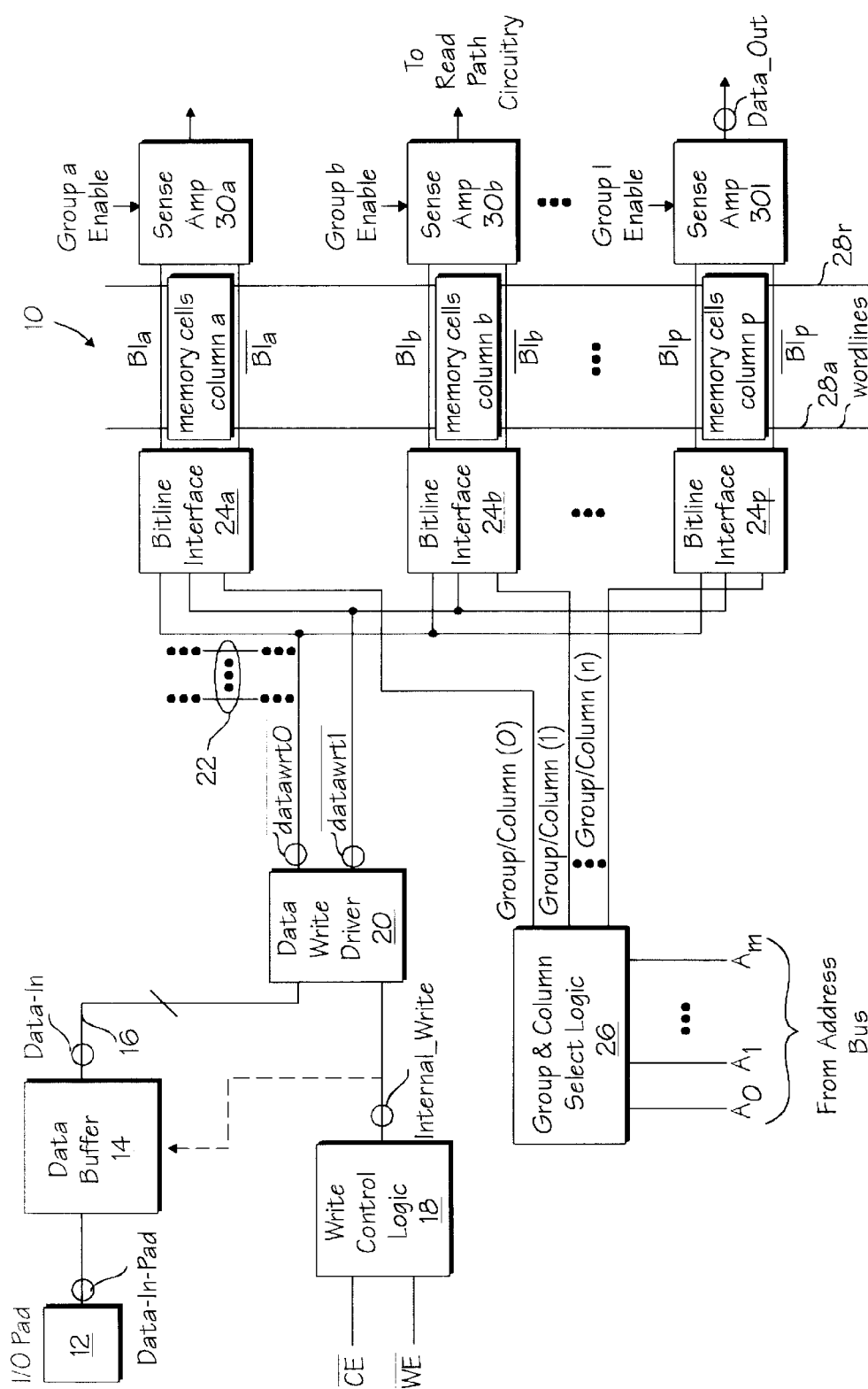
FIG. 1 illustrates a write architecture for a conventional SRAM.

In one embodiment, the present invention provides a write control method for a ×16 word-format, memory device (e.g., an asynchronous SRAM) with individual byte control signals. Although well suited for ×16 devices, the method is convertible to accommodate lower word-format (e.g., ×8 and lower) memory devices. In any instance, the present invention provides reduced control adjustment design time, improved chip enable access time, and improved, balanced write parameter margins for a memory device as compared with schemes of the past.

In one embodiment of the present invention, a reduced complexity control circuit uses slow slope write control signals as inputs, preferably taken immediately after the first stage of stabilized trip point input buffers. Further, the present invention allows the use of a split path for chip enable control signals, taken off the slow slope signal delivered by a chip enable input buffer, with the trip point skewed in opposite directions for address and write paths to obtain high speed power-up for power gated input buffers and high speed end-of-write for the write control path. In various embodiments, the present invention achieves these advantages, in part, by: (1) time-balancing delays for write pulses delivered by the multiple write control signals in the CCS block; (2) allowing independent alignment of the falling and rising edges of a data write pulse, providing proper timing of an internal write pulse for circuit(s) which ATD-gate the data write access to the bitlines; (3) allowing the use of a three step delay-tuning method for the time-balanced CCS block and related data delay circuits; (4) generating read control signals in the CCS block, intermediate signals in the logic generating the global internal write pulse; and (5) duplicating the CCS block on opposite sides of the memory device, each CCS block being driven by a different of the two byte (most significant/least significant) control signals in the case of a ×16 word-format memory device. The present invention also provides reduced standby and transient write currents in the memory device, in part, by: (1) powering down the input buffers in standby and gating the data input buffers with a combination of the write control signals; and (2) using a quarter-enabled data write bus pulse, cross-controlled between a most significant block address and the byte control signals.

The reduced complexity write control circuit, and companion timing algorithm for its delay blocks, is able to deliver properly timed global internal write pulses to data write bus drivers of the memory device. The write control circuit facilitates improved write parameter margins if the data write pulses produced by the data write drivers are subsequently gated by an ATD pulse before accessing the bitlines (as described in co-pending application Ser. No. 08/855,040) and the stability of the write parameter margins is improved if the input write control signals are taken from stabilized trip point input buffers. The reduced complexity and ease of adjustability is achieved in the CCS block by first time-balancing (e.g., through a delay-equalizing process) the possible write pulses from the signals which control the write process (e.g., write enable $\overline{WE}$, chip enable $\overline{CE}$ and byte-high enable $\overline{BHE}$/byte-low enable $\overline{BLE}$) and then combining the three control signals to generate a global internal write pulse whose leading edge timing can also be adjusted.

Figure 2:
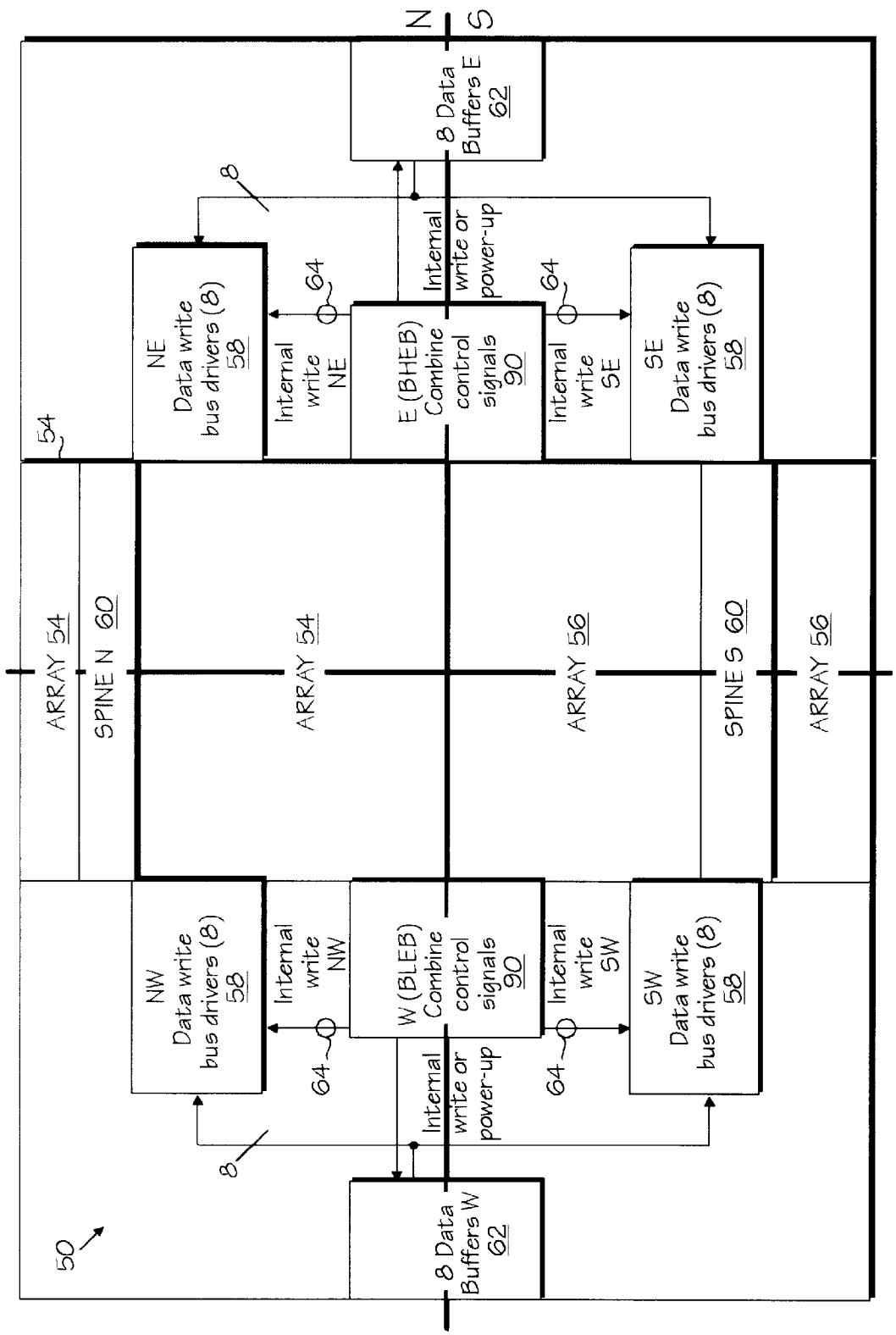
FIG. 2 illustrates an exemplary ×16 word-format memory device configured according to one embodiment of the present invention.

A most significant block address may also be combined into the global internal write pulse to reduce transitory currents within the memory device at the data write bus lines transitions by quarter enabling the data write bus lines in combination with byte-high enable $\overline{BHE}$/byte-low enable $\overline{BLE}$ signals. For example, as shown in FIG. 2, for a ×16 word-format memory device 50 which includes a memory array 52 arranged as North and South blocks 54 and 56, respectively, each having an East and a West portion (thus defining North-East, South-East, South-West and North-West quarters), in one embodiment the data write bus drivers 58 may be placed (e.g., in a chip layout) at the input of one or more spine(s) 60, away from the data input buffers 62, and the most significant block (i.e., North/South) address may be included in the internal write pulse 64 to implement the quarter controlled data write pulse technique. Alternatively, for the example shown in FIG. 3 where a memory device 80 includes a memory array 82 which is organized into East and West portions only (e.g., halved or interleaved), the data write bus drivers 84 can be inserted adjacent to the data input buffers and the block address is not combined with the three East/West specific write process control signals (e.g., write enable $\overline{WE}$, chip enable $\overline{CE}$ and byte-high enable $\overline{BHE}$/byte-low enable $\overline{BLE}$) to generate the global internal write pulse 86.

Figure 3:
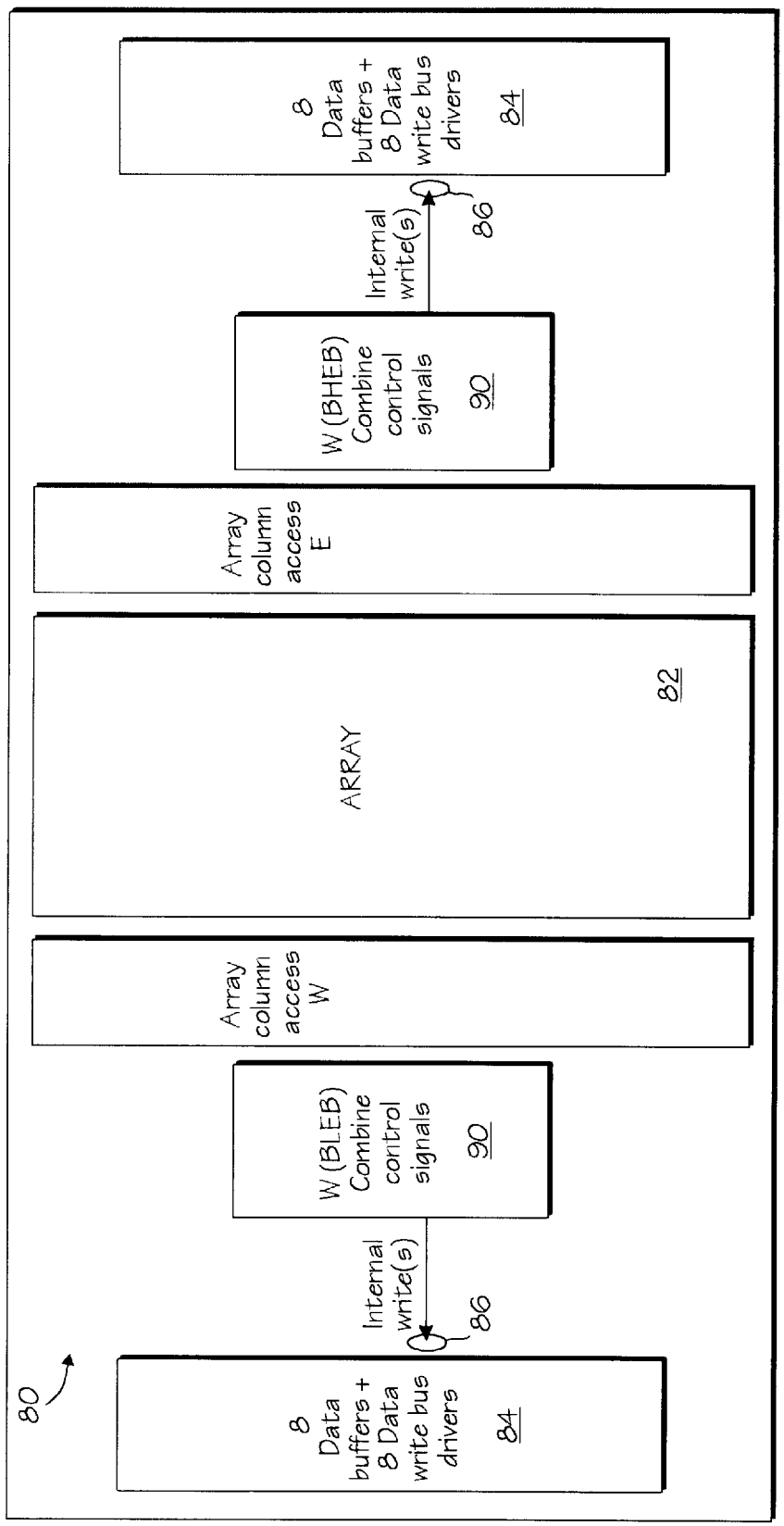
FIG. 3 illustrates an alternative configuration for a ×16 word-format memory device according to a further embodiment of the present invention.
Figure 4:
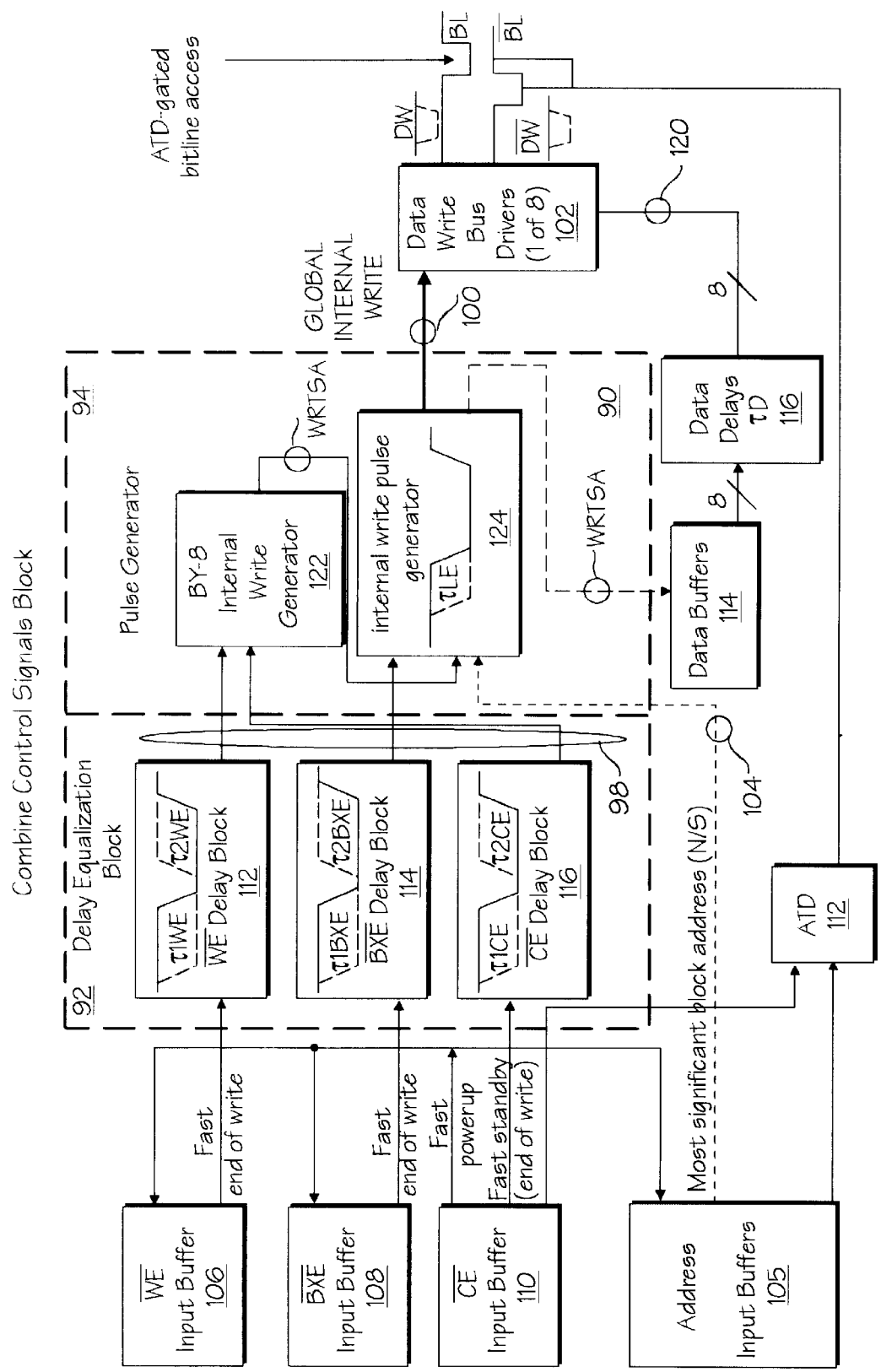
FIG. 4 illustrates a combine control signals block for a ×16 word-format memory device according to an embodiment of the present invention.

The combine control signals block 90, shown in FIGS. 2 and 3 as the source of an internal write pulse 64 or 86, respectively, is further illustrated in FIG. 4. Combine control signals (CCS) block 90 includes a delay equalization block 92 and pulse generator 94, coupled together as shown. Delay equalization block 92 receives the write control signals 96 (e.g., write enable $\overline{WE}$, chip enable $\overline{CE}$ and byte-high/low enable $\overline{BXE}$, where the "X" indicates that the signal may be for the block of the memory array corresponding to the high byte or to the low byte) which are provided to the memory device and provides individual, time-balanced write control signals 98 to pulse generator 94. Pulse generator 94 combines the time-balanced write control signals 98 to produce the global internal write pulse 100 which may be provided to the data write bus drivers 102 within the memory device. Optionally (depending on the chosen architecture for the memory device), the most significant block address 104 may be provided to pulse generator 94 from the corresponding one of a plurality of power gated address input buffers 105, as discussed above with reference to FIGS. 2 and 3.

The write control signals 96 are provided from stabilized trip point input buffers 106, 108 and 110 associated with these signals. The design of these stabilized trip point input buffers is further discussed in co-pending application Ser. No. 08/696,008, entitled "Input buffer with stabilized trip points" filed, Aug. 12, 1996, by Julian Gradimarie and assigned to the assignee of the present invention, the entire disclosure of which is incorporated herein by reference. Each of the input buffers 106, 108 and 110 delivers a slow slope signal to the CCS block 90, preferably from a weak inverter used in a hysteresis feedback circuit which follows an input stage of the buffer. The chip enable input buffer 110 is different from the other write control signal input buffers 106 and 108 for two reasons: first, it cannot power gate itself (but it does power gate the other write control signal input buffers and the address input buffers 105); second, it delivers two chip enable control signals: (1) a high speed power-up signal to the other input buffers 105, 106 and 108; and (2) a high speed end of chip enable-controlled write signal to the CCS block 90. This approach allows $T_{ace}$ (chip enable read access time) to closely follow $T_{aa}$ (address read access time), as compared to the case where the chip enable signal input buffer 110 delivers only one signal to the power gated input buffers as well as to the control circuitry (CCS block 90). As discussed above, for fast SRAMs, the write control signal input buffers 106 and 110 should be duplicated on both sides of the memory device, to take full advantage of the time-balanced delay CCS block 90 which is itself duplicated. Of course, as is apparent from FIGS. 2 and 3, the byte high enable $\overline{BHE}$ and byte-low enable $\overline{BLE}$ input buffers (e.g., input buffer 108) are used only one time (e.g., $\overline{BHE}$ in the East block and $\overline{BLE}$ in the West block).

Within the delay equalization block 92, each of the write control signals 96 is provided to a corresponding delay block 112, 114 and 116. Each of the delay blocks 112, 114 and 116 subjects the corresponding input write control signal to a tuned delay so that the respective output signals from the delay blocks are time-balanced with respect to one another (i.e., the leading and trailing edges of the output signals from the delay blocks are aligned in time, when monitored at the global internal write 100 level). These time-balanced write control signals 98 are then used to produce the global internal write pulse 100, a unique time instance global internal write pulse, whose start/end transitions should thus occur at the same time instance no matter which of the control signals started/ended the write operation.

As indicated above, the design is mainly targeted for memory devices using an address transition detection (ATD) pulse to dynamically equalize the bitlines and gate the access of the data write to the bitlines (e.g., as described in co-pending application Ser. No. 08/855,040.

Thus, shown in FIG. 4 is an ATD pulse generating circuit 112 which receives address signals from the address input buffers 105 and a chip enable signal from $\overline{CE}$ input buffer 110 and generates the ATD pulse in the conventional fashion. The ATD pulse is used to gate the data write signals DW and $\overline{DW}$ produced by the data write drivers 102, preferably at a data write bus to bitline interface in the memory device. Data write signals DW and $\overline{DW}$ are logic complements of one another during write operations and are applied to the bitlines BL and $\overline{BL}$ to write data into selected memory cells of the memory device. The data write signals DW and $\overline{DW}$ are produced by data write drivers 102 which gate data signals 120 from data input buffers 114, as delayed by data delay blocks 116, with the global internal write signal 100 from CCS block 90. For the case illustrated in FIG. 4, there should be eight data write drivers on each side (e.g., East/West) of the chip. In addition, the design may be used with other memory devices (i.e., those which do not use ATD to gate the data write access to the bitlines).

As illustrated, within the combine control signals block 90, the first stage in the write control path for each of the write control signals (write enable $\overline{WE}$, chip enable$\overline{CE}$ and byte enable $\overline{BXE}$) is a delay block. These three delay blocks 112, 114 and 116 perform the time-balancing (delay equalization) of the write control pulses 96 which can be individually generated by the three corresponding write control signals. Preferably, this operation should be performed through trip point adjustments introducing as little delay as possible. Next, the time-balanced write control signals 98 are combined to produce the global internal write signal 100. To allow for easy use of this write control concept for lower word-format parts (e.g., ×8 and lower), the time balanced write enable $\overline{WE}$ and chip enable $\overline{CE}$ signals are combined first (e.g., using a NOR gate or other suitable logic) in a ×8 internal write generator 122, generating the WRTSA signal (which may be used as the global internal write signal for a ×8 or lower word-format part). In Boolean terms, WRTSA=$\overline{CE}_{98}$+$\overline{WE}_{98}$, where $\overline{CE}_{98}$ denotes the time-balanced chip enable signal and $\overline{WE}_{98}$ denotes the time-balanced write enable signal from delay blocks 116 and 112, respectively. Another goal is attained by combining the signals in this fashion: WRTSA is not only an intermediate signal needed in the generation of the global internal write signal 100, it is also a read-control signal which can be used to turn off the sense-amps in the read path of the memory device during a write.

The write enable $\overline{WE}$—chip enable$\overline{CE}$ combined signal (WRTSA) may also be used to gate the data signals off the first stage of the data input buffers 114, for current reduction purposes. For example, as shown by the dashed line in FIG. 4, signal WRTSA may be provided from CCS block 90 to data buffers 114 in the data path of the memory device to gate the data buffers, thereby allowing each pair of data write lines in the data write bus 120 to be the logic complement of one another only during a time interval when a write operation is to be performed.

From internal write generator 122, signal WRTSA is then combined with $\overline{BXE}$ (appropriately delayed by delay block 114), in global internal write pulse generator 124 (e.g., in a NAND gate or other suitable logic) to generate an internal write signal WRTDBB, whose leading edge delay can be adjusted using a further $\tau_{LE}$ delay block (functionally illustrated as being within write pulse generator 124). In Boolean terms, roughly:

$$WRTDBB(t) = \overline{CE}_\tau(t) + \overline{BXE}_\tau(t) + \overline{WE}_\tau(t) + \overline{CE}_\tau(t-\tau_{LE}) + \overline{BXE}_\tau(t-\tau_{LE}) + \overline{WE}_\tau(t-\tau_{LE}),$$

where the index $\tau$ designates the balanced delay incurred by the trailing edge of the internal write pulse from any of the write control signal pads to WRTDBB.

For the case where the most significant block address 104 is not used in the logic generating the global internal write signal, signal WRTDBB is the global internal write signal 100. However, because a memory array redundancy scheme may require more flexibility (e.g., to accommodate the possibility of replacement with spare columns located either in the North or South), even in cases where the most significant block address 104 is used in the logic generating the global internal write signal, it should not be combined with signal WRTDBB to produce a global redundant internal write signal.

For memory arrays such as the one illustrated in FIG. 2, however, the present invention does allow for the use of a quarter-targeted data write bus enabling technique to reduce the transient currents at the regular global internal write transitions. This is done by using a cross-control (quarter-targeted) between the most significant block address (North/South) 104 in FIG. 4 and the byte control signals $\overline{BHE}$/$\overline{BLE}$ (East/West in FIG. 2). Hence, on each side of the memory device, signal WVRTDBB is combined with the most significant block address signal 104 (e.g., using a NOR gate or other suitable logic) to provide two global internal write signals, one towards the spine in the North and one towards the spine in the South. These signals can now drive reduced complexity data write drivers 102 if the ATD pulse is used to gate the input path at the data write bus to bitline interface.

Figure 5:
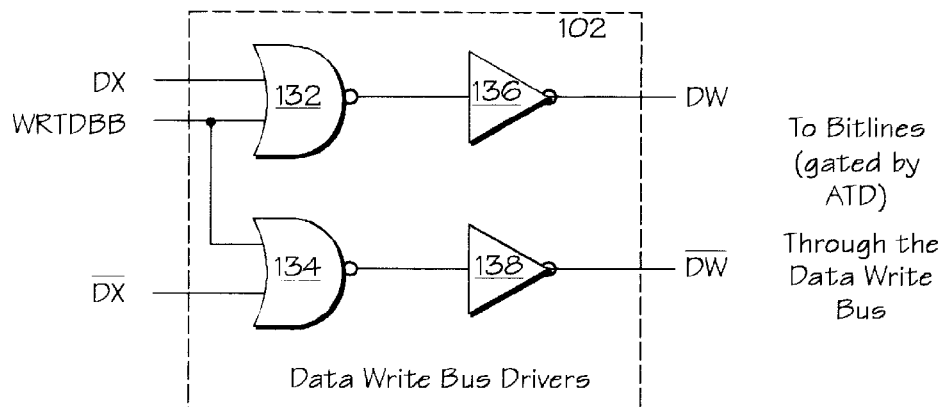
FIG. 5 illustrates an exemplary reduced complexity data write driver for use according to one embodiment of the present invention.

An example of a reduced complexity data write driver 102 (e.g., 1 of 32 for the case illustrated in FIG. 2) is shown in FIG. 5. Data signal pairs DX and $\overline{DX}$ (X=1–16) are combined with the global internal write signal WRTDBB (which was earlier combined with the most significant block address signal 104) using NOR gates 132 and 134, respectively. The output of the NOR gates 132 and 134 are provided to inverters 136 and 138, respectively, to produce the data write signals DW and $\overline{DW}$. These data write signals may now be transmitted through the data write bus(es) along the spine(s) to the bitline interfaces where they are gated by the ATD pulse as described in co-pending application Ser. No. 08/855,040.

If an ATD-gated data write to bitline access is used, besides being stable, the write parameter margins are also much improved and balanced (aligned over the multiple write control signals) if the following three-step method for tuning the control signal delay blocks is used.

First, after time-balancing the three write control signals in delay blocks 112, 114 and 116, with the delay $\tau_{LE}$ of the internal write pulse generator 124 set to a minimum, the delays of blocks 112, 114 and 116 are equally increased so that at the level where the fastest ATD pulse (e.g., typically the fastest address occurs for the $T_{ha}$ test condition) gates the data write access to the bitlines, the end of the internal write pulse trails the end of the ATD pulse (when the address switches at the desired $T_{ha}$ margin) with a don't write margin (DWM) of approximately 700–800 psec, at the worst simulation conditions (e.g., fast transistors, high voltage, low temperature). Note, in order to determine the $T_{ha}$ margin, any of the write control signals can be used in the simulations to control the write if the internal write pulse is already aligned.

Figure 6A:
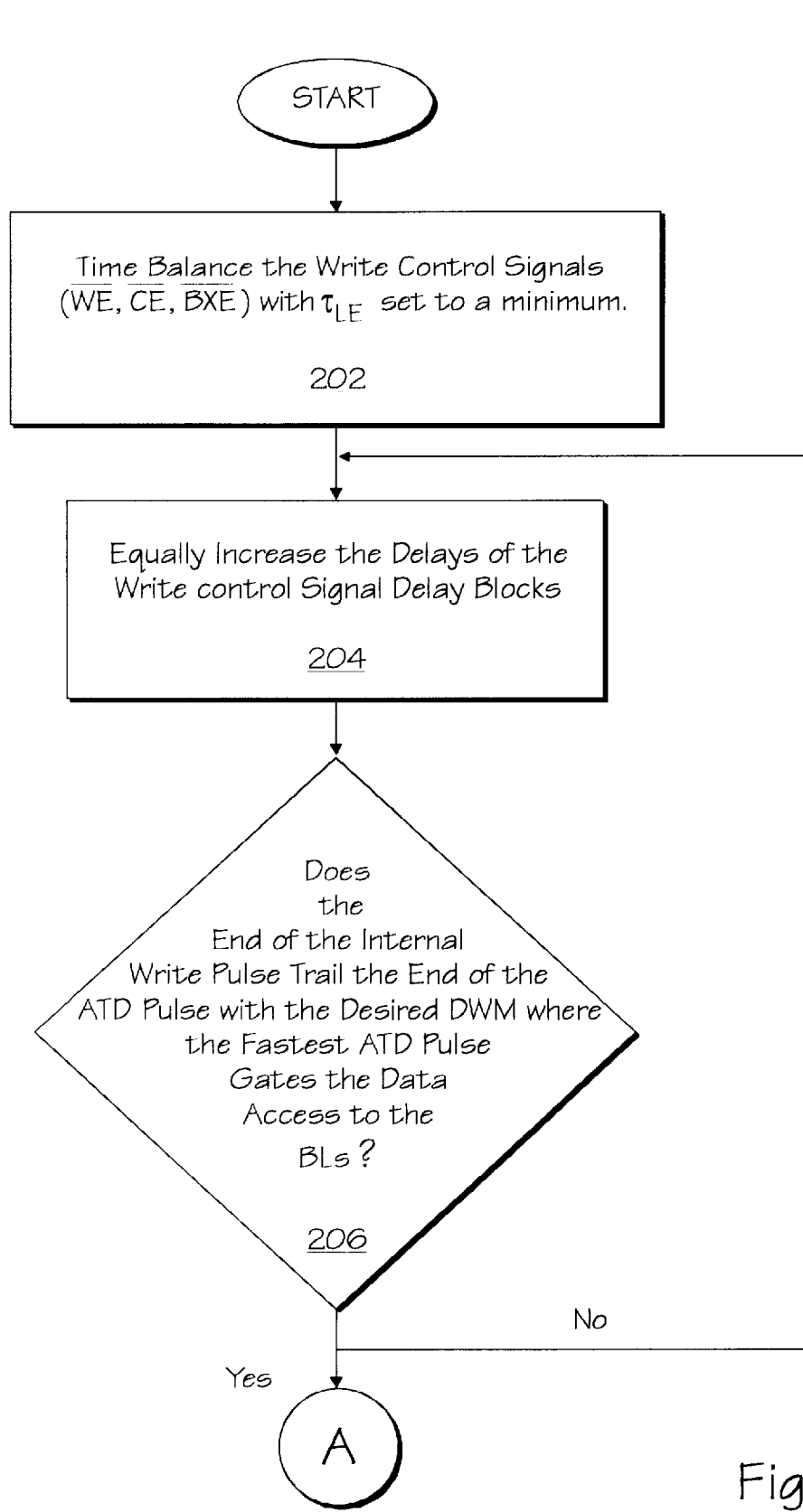
FIGS. 6A, 6B and 6C are flow diagrams illustrating various steps for tuning the control signals block of FIG. 4 according to one embodiment of the present invention.

This step is illustrated in the flow diagram of FIG. 6A. Process 200 (which is continued in FIGS. 6B and 6C) begins at step 202 where the three write control signals (write enable $\overline{WE}$, chip enable $\overline{CE}$ and byte enable $\overline{BXE}$) are time balanced with the delay $\tau_{LE}$ of the leading edge of the global internal write pulse 100 set to a minimum. At step 204, the delays $\tau_{WE}$, $\tau_{BXE}$ and $\tau_{CE}$ of the write control signal delay blocks 112, 114 and 116 are increased. As these delays are increased, at step 206 a monitoring operation is carried out to determine whether the end of the global internal write pulse 100 trails the end of the ATD pulse by the desired DWM. As indicated above, this monitoring is preferably performed under conditions where the fastest ATD pulse gates the data write to bitline access. When the desired DWM has been obtained, process 200 advances.

Second, the delay $\tau_{LE}$ in the internal write pulse generator 124 (i.e., the delay for the leading edge of the global internal write signal 100) is increased so that at the level where the slowest ATD pulse (e.g., typically the slowest address occurs for the $T_{sa}$ test condition) gates the data write access to the bitlines, the beginning of the internal write pulse leads the beginning of the ATD pulse (where the address switches at the desired $T_{sa}$ margin) with a DWM using worst simulation conditions (e.g., slow transistors, high voltage, low temperature). Again, if the internal write pulse individually generated on each side of the chip by the corresponding three write control signals were already aligned in the CCS block 90, any of the write control signals can be used for this adjustment.

Figure 6B:
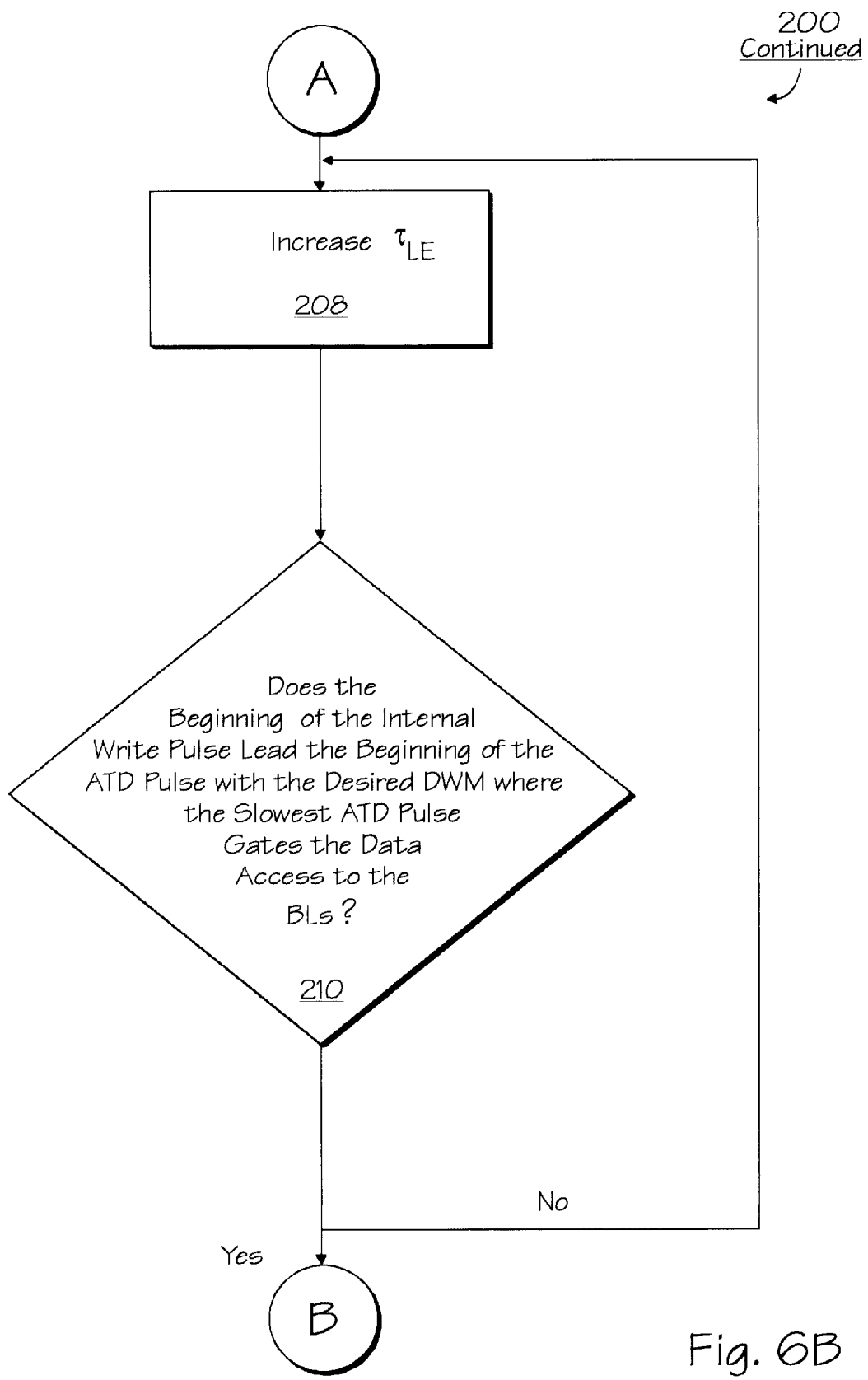
Figure 6C:
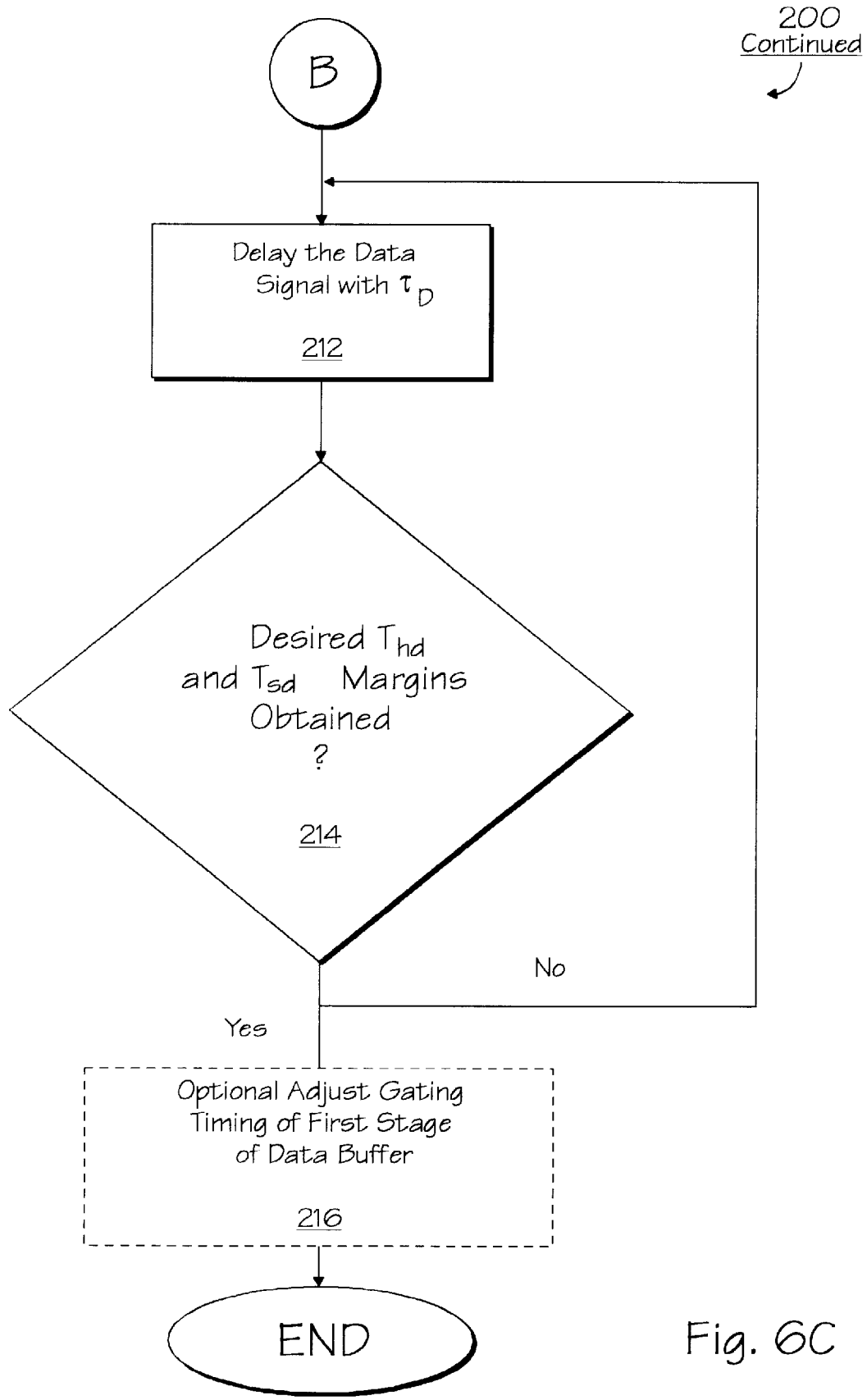

The flow diagram of FIG. 6B illustrates this step in process 200. $\tau_{LE}$ is increased (step 208) unitl the leading edge of the internal write pulse 100 leads the beginning of the ATD pulse with the desired DWM (step 210). When this condition has been satisfied, process 200 advances.

Third, the data signal is delayed with $\tau_D$ in the data delay block 116 to obtain the desired $T_{hd}$ (data hold) margin, in trade off with the desired $T_{sd}$ (data set-up) margin. If the data buffers 114 are also power gated—which is preferable—the timing of the first stage of the data buffer gating is adjusted so as not to mask valid data in the global internal write window. This last part of process 200 is illustrated in the flow diagram of FIG. 6C where $\tau_D$ is adjusted (step 212) unitl the desired margins have been obtained (step 214). As shown, the gating timing adjustment of the first stage of the data buffer (step 216) is optional (and is preferably done for the case of a power gated data buffer).

Figure 7:
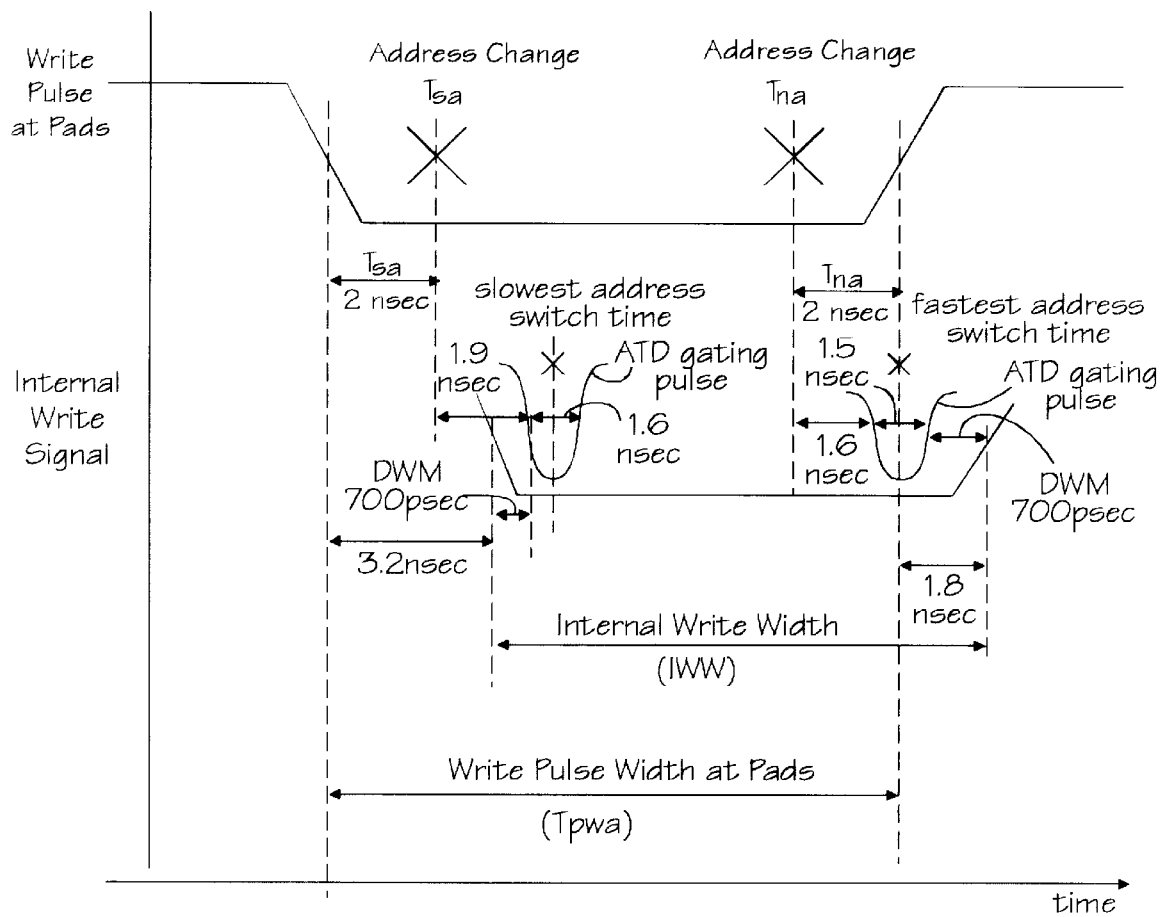
FIG. 7 illustrates internal write control timing considerations in a memory device configured in accordance with the present invention.

An example of the timing involved in the first two steps of the above described adjustment method is illustrated in FIG. 7. Note the high efficiency of the method, which allows the computation of the necessary delays of the leading and trailing edge of the global internal write (with respect to the corresponding edges of the write pulse at the pads) after just one simulation, done to determine DWM and the fast/slow ATD timing. In the illustration, the "Write Pulse at Pads" is the narrowest write pulse for the logic OR of the active low write control signals (e.g., $\overline{WE}$, $\overline{CE}$ and $\overline{BXE}$). For this example, the desired $T_{sa}$ and $T_{ha}$ margins were 2 nsec, the DWM was 700 psec, the ATD pulse width was approximately 1.5–1.6 nsec and, because the addresses were switching close to the middle of the ATD pulses, the write parameter ($T_{sa}$ and $T_{ha}$) margin improvement (over the case where the ATD does not gate the data-in path) was about 800 psec (for a further explanation of the use of the ATD pulse in this fashion, see co-pending application Ser. No. 08/855,040). In particular, the delays for the leading and trailing edges of the global internal write pulse are determined as:

$$\begin{aligned}\text{Delay Trailing Edge} &= \Delta(\text{Begining of fast } ATD \text{ gating pulse}) + \\ &\quad ATD \text{ gating pulse width} + DWM - T_{ha} \\ &= 1.6 \text{ nsec.} + 1.5 \text{ nsec} + 0.7 \text{ nsec} - 2 \text{ nsec} \\ &= 1.8 \text{ nsec}\end{aligned}$$

-continued

Delay Leading Edge = $T_{sa}$ + Δ(Beginning of slow ATD gating pulse) − DWM

= 2 nsec + 1.9 nsec − 0.7 nsec

= 3.2 nsec

The width of the internal write pulse is:

IWW = $T_{pwe}$ + delay trailing edge − delay leading edge

= $T_{pwe}$ + Δ(Beginning of fast ATD gating pulse) +

ATD gating pulse width +

2DWM − $T_{ha}$ − $T_{sa}$ − Δ(Beginning of slow ATD gating pulse)

= $T_{pwe}$ + 1.8 nsec − 3.2 nsec

= $T_{pwe}$ − 1.4 nsec

One further aspect of the present invention concerns transitory current reduction. Assuming the most significant block address is not included in the global internal write pulse, the capacitance on each data write bus line is approximately 3 pF in a memory device configured to accept the above described circuitry. Assuming solid data (e.g., all bits either logic 1 or logic 0) is written, 16 such lines will transition at each global internal write transition. Assuming a 5 V Vcc and a 5 V/nsec transition slope, the total current is: i=16×(3×10$^{-3}$nF) ×5 V/nsec=240 mA. This value may be cut in half by including the most significant block (i.e., North/South) address in the global internal write pulse in the preferred embodiment because only one half the number of data lines will be switching.

The present invention provides advantages over schemes of the past by using the combine control signals (CCS) block 90. Notably, the CCS block 90 has comparable complexity with the control blocks used in prior 8-bit internal word-format memories, and yet is still able to accommodate the multitude of possibilities to initiate and/or end a write using the multiple write control signals, instead of just a write enable and/or chip enable signal. Further, the present invention provides stable, balanced (aligned over the multiple write control signals) and improved write parameter margins over a large range of technology, temperature and/or supply voltage corners, especially when driving a circuit which ATD-gates the data write bus to bitline access. This is a major advantage over conventional schemes which provide control logic targeted to drive data write bus to bitline interfaces gated only by a combination of addresses or which use unstabilized trip point input buffers. In addition, the present invention provides improved write parameter margins in spite of resorting to a simple data write driver whereas schemes of the past relied on relatively complex data-latched drivers, combined data write driver/level restoring circuits, address-only gated data write bus to bitline interfaces or internal write pulse edge timing and slope adjustment.

The present invention also reduces the standby current in trade off with an improved chip enable read access time $T_{ace}$ using a much less complex, separate, fast power-up path solution, compared to the ATD-inhibit circuit schemes of the past (which could, potentially, mask real address transitions during power-up). Further still, the present invention reduces the transient write current with respect to memories using a single spine, where only half of the total data write bus is pulsed, while the presently preferred embodiment of the invention controls each quarter of the memory array by including the most significant block address in the global internal write pulse. The present invention also saves control adjustment design time by allowing the use of the above-described three-step delay-tuning method in the time-balanced CCS block 90 and the data delay circuits 116, as compared to previous memory devices where the alignment of the write parameter margins for each of the multiple signals controlling the write process is very difficult.

Thus, a write control method for a memory device with individual byte control signals has been described. In the forgoing description, certain examples and illustrations were used to clarify aspects of the present invention, however, it should be recognized that these examples were merely for purposes of explanation and should not limit the spirit and scope of the present invention as set forth in the appended claims.

What is claimed is:

1. A method, comprising:
    time-balancing a plurality of write control signals in a memory device; and
    combining the time-balanced write control signals to generate a global internal write pulse for the memory device.

2. The method of claim 1 further comprising delaying the leading edge of the global internal write pulse.

3. The method of claim 2 further comprising combining the global internal write pulse with a most significant block address signal for the memory device.

4. The method of claim 2 further comprising controlling access of a data signal to a data write bus in the memory device using the global internal write signal.

5. The method of claim 4 wherein the data signal is time delayed within a data path of the memory device.

6. The method of claim 1 wherein fewer than all of the time balanced write control signals are combined to generate a first control signal, the first control signal being used to generate the global internal write pulse.

7. The method of claim 6 further comprising applying the first control signal to a read path circuitry of the memory device to disable the read path circuitry during a write operation.

8. The method of claim 6 further comprising applying the first control signal to a data path circuitry of the memory device to permit a pair of data write lines of the data path to be driven to logic complements of one another only when a write operation is to be performed.

9. The method of claim 1 further comprising powering down, in standby operations, input buffers which provide the plurality of write control signals.

10. The method of claim 1 further comprising providing the plurality of write control signals from respective ones of a plurality of stabilized trip point input buffers.

11. The method of claim 10 further comprising power gating one or more of the stabilized trip point input buffers with one of the plurality of write control signals provided by a corresponding first one of the stabilized trip point input buffers.

12. A method, comprising:
    time-balancing a first plurality of write control signals in a memory device with a delay of a leading edge of a global internal write pulse produced from the first plurality of write control signals set to a minimum to achieve a desired margin between a trailing edge of the global internal write pulse and a trailing edge of an address transition detection pulse in the memory device; and
    increasing the delay of the leading edge of the global internal write pulse to achieve a desired margin between the leading edge of the global internal write pulse and the leading edge of the address transition detection pulse.

13. The method of claim 12 further comprising adjusting a time delay of a data signal within the memory device to achieve desired data set up and data hold margins, wherein the global internal write pulse is used to control the access of the data signal to a data write bus within the memory device.

14. The method of claim 12 wherein the first plurality of write control signals comprises three signals.

15. The method of claim 12 further comprising repeating the steps of time balancing and increasing the delay for a second plurality of write control signals in the memory device, the second plurality of write control signals controlling write operations to a separate portion of a memory array of the memory device than the first plurality of write control signals.

* * * * *